(12) United States Patent
Kaczynski et al.

(10) Patent No.: US 9,419,662 B2
(45) Date of Patent: Aug. 16, 2016

(54) HIGH-VOLTAGE RADIO-FREQUENCY ATTENUATOR

(71) Applicant: QUALCOMM Incorporated, San Diego, CA (US)

(72) Inventors: Brian James Kaczynski, Cracow (PL); Emmanouil Terrovitis, Athens (GR)

(73) Assignee: QUALCOMM INCORPORATED, San Diego, CA (US)

( * ) Notice: Subject to any disclaimer, the term of this patent is extended or adjusted under 35 U.S.C. 154(b) by 38 days.

(21) Appl. No.: 14/535,928

(22) Filed: Nov. 7, 2014

(65) Prior Publication Data

US 2016/0134312 A1 May 12, 2016

(51) Int. Cl.
| | |
|---|---|
| H04B 1/06 | (2006.01) |
| H04B 7/00 | (2006.01) |
| H04B 1/10 | (2006.01) |
| H03H 7/25 | (2006.01) |
| H03H 11/24 | (2006.01) |
| H04B 1/16 | (2006.01) |
| H04B 5/00 | (2006.01) |
| H01L 29/92 | (2006.01) |
| H04B 1/18 | (2006.01) |

(52) U.S. Cl.
CPC .............. *H04B 1/109* (2013.01); *H03H 7/25* (2013.01); *H03H 11/245* (2013.01); *H04B 1/16* (2013.01); *H04B 5/0012* (2013.01); *H04B 5/0025* (2013.01); *H01L 29/92* (2013.01); *H04B 1/18* (2013.01)

(58) Field of Classification Search
CPC ..... H03G 3/3052; H03G 3/22; H03G 3/3068; H03G 1/04; H04B 1/109; H04B 5/0025; H04B 5/0012; H04B 1/16; H03H 11/245

USPC ............ 455/249.1, 252, 289, 333; 333/81 R, 333/103; 327/308

See application file for complete search history.

(56) References Cited

U.S. PATENT DOCUMENTS

| | | | |
|---|---|---|---|
| 5,485,292 A | 1/1996 | Wong et al. | |
| 7,626,474 B2 | 12/2009 | Mullen et al. | |
| 8,653,905 B2 | 2/2014 | Ryu et al. | |
| 2005/0195053 A1 | 9/2005 | Uemura | |
| 2006/0217078 A1* | 9/2006 | Glass | H03G 1/0088 455/78 |
| 2008/0088392 A1* | 4/2008 | Yamamoto | H03F 1/3276 333/81 R |
| 2008/0149981 A1* | 6/2008 | Lamey | H01L 23/642 257/306 |

(Continued)

OTHER PUBLICATIONS

International Search Report and Written Opinion—PCT/US2015/056731—ISA/EPO—Apr. 12, 2016.

(Continued)

*Primary Examiner* — Nhan Le (74) *Attorney, Agent, or Firm* — Procopio, Cory, Hargreaves & Savitch LLP (57) ABSTRACT

A variable attenuator can be used with high-voltage radio-frequency signals. The attenuator can provide wide dynamic range with little loss at the lowest attenuation level. The attenuator may be implemented in digital integrated circuit processes and occupies small integrated circuit area. Additionally, the use of circuit elements external to the SoC may be reduced. The attenuator uses multiple attenuator cells connected in parallel to an RF input and RF output. The attenuator cells use capacitive dividers with pair of capacitors laid out in the same integrated circuit area. The capacitors are also laid out so that the RF input shields the RF output from ground to avoid parasitic capacitance on the RF output.

38 Claims, 7 Drawing Sheets

(56) References Cited

U.S. PATENT DOCUMENTS

| | | | |
|---|---|---|---|
| 2009/0174484 A1* | 7/2009 | Yamamoto | H03G 1/0052 330/284 |
| 2009/0273411 A1 | 11/2009 | Roufoogaran | |
| 2011/0298569 A1 | 12/2011 | Tzuang et al. | |
| 2013/0300523 A1 | 11/2013 | Johnson | |
| 2014/0022019 A1 | 1/2014 | Trulls | |
| 2014/0266518 A1 | 9/2014 | Wang et al. | |
| 2015/0004909 A1* | 1/2015 | Agrawal | H04B 5/0031 455/41.1 |

OTHER PUBLICATIONS

Partial International Search Report—PCT/US2015/056731—ISA/EPO—Feb. 5, 2016.

* cited by examiner

FIG. 9

HIGH-VOLTAGE RADIO-FREQUENCY ATTENUATOR

BACKGROUND

1. Field

The present invention relates to integrated circuits and, more particularly, to high-voltage radio-frequency attenuators.

2. Background

A variable attenuator can be used in a radio-frequency receiver to attenuate large received signals before the signals reach sensitive receiver devices. A received signal from an antenna could be so large that it would damage some receiver circuits. For example, the signal from an antenna in a near-field communication (NFC) system can be as large as 100 volts.

Figure 9:
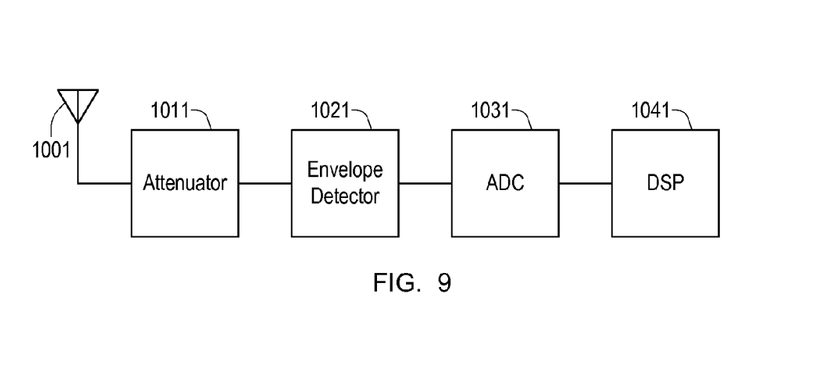
FIG. 9 is a functional block diagram of a radio-frequency receiver illustrating use of a high-voltage radio-frequency attenuator.

FIG. 9 is a functional block diagram of a radio-frequency receiver illustrating use of a high-voltage radio-frequency attenuator 1011. The radio-frequency attenuator 1011 receives a radio-frequency (RF) signal from an antenna 1001 and selectively attenuates the RF signal. The attenuated RF signal is supplied to an envelope detector 1021. The envelope detector 1021 supplies its output to an analog-to-digital converter (ADC) 1031. The output of the ADC 1031 is processed by a digital signal processor 1041.

Implementing the radio-frequency receiver (e.g., for NFC) in a system-on-a-chip (SoC) integrated circuit is difficult. For example, interfacing high-voltage (e.g., 100 V differential peak-to-peak) RF signals from the antenna to receiver circuits implemented in a sub-micron SoC is challenging since the SoC fabrication technology is developed for low voltages (e.g., 1 V). Some prior NFC receivers, for example, have used capacitors and other circuit elements external to an SoC for attenuation to handle high voltages.

Additionally, the RF signals can have a large dynamic range (e.g., 55 dB). Some prior NFC receivers have used variable attenuators with significant attenuation in the lowest attenuation setting. This results in a weak signal that can degrade performance of the receiver. Accordingly, performance of the receiver can be improved if the attenuator passes the smallest RF signals with minimal attenuation.

SUMMARY

In one aspect, a high-voltage radio-frequency (RF) attenuator for selectively attenuating an RF input to produce an RF output is provided that includes: an attenuator cell including a coupling capacitor having a first terminal connected to the RF input and a second terminal connected to the RF output, and a dividing capacitor having a first terminal connected to the RF output and a second terminal connected to a switch to a ground reference, wherein the coupling capacitor and the dividing capacitor are formed in a same integrated circuit area.

In one aspect, a high-voltage radio-frequency attenuator for selectively attenuating an RF input including a positive RF input and a negative RF input to produce an RF output including a positive RF output and a negative RF output is provided. The attenuator includes an attenuator cell including a positive-side capacitive divider including a coupling capacitor having a first terminal connected to the positive RF input and a second terminal connected to the positive RF output, and a dividing capacitor having a first terminal connected to the positive RF output, a second terminal of the dividing capacitor connected to a first switch to a ground reference, wherein the coupling capacitor and the dividing capacitor are formed in a same integrated circuit area, and a negative-side capacitive divider including a coupling capacitor having a first terminal connected to the negative RF input and a second terminal connected to the negative RF output, and a dividing capacitor having a first terminal connected to the negative RF output, a second terminal of the dividing capacitor connected to a second switch to the ground reference, wherein the coupling capacitor and the dividing capacitor are formed in a same integrated circuit area.

In one aspect, a method is provided for variably attenuating a radio-frequency (RF) input. The method includes: coupling the RF input to an RF output using a plurality of coupling capacitors; and conditionally connecting terminals of a plurality of dividing capacitors to ground, wherein each coupling capacitor of the plurality of coupling capacitors is formed in a same integrated circuit area as one of the plurality of dividing capacitors.

In one aspect, an apparatus is provided that includes: a means for a coupling capacitor means having a first terminal connected to an RF input and a second terminal connected to an RF output, and a dividing capacitor means having a first terminal connected to the RF output and a second terminal connected to a switch to a ground reference, wherein the coupling capacitor means and the dividing capacitor means are formed in a same integrated circuit area.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
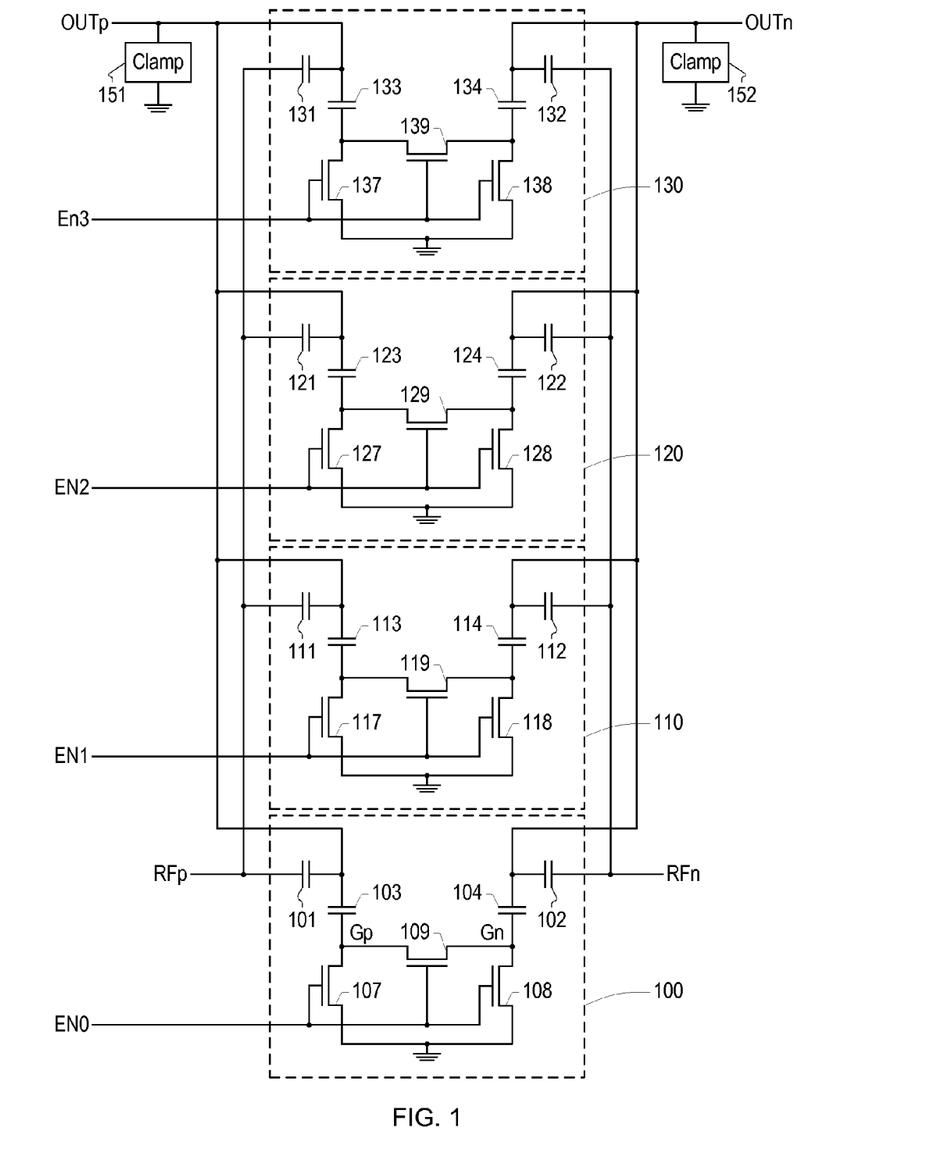
FIG. 1 is a schematic diagram of an attenuator according to a presently disclosed embodiment.

FIG. 1 is a schematic diagram of an attenuator according to a presently disclosed embodiment. The attenuator may be implemented, for example, in a complementary metal oxide semiconductor (CMOS) system-on-a-chip (SoC) integrated circuit (IC). The attenuator may be used in a radio-frequency receiver, for example, the near-field communication receiver of FIG. 9.

The attenuator of FIG. 1 receives a differential radio frequency (RF) input (positive input RFp and negative input RFn) and produces a differential RF output (positive output OUTp and negative output OUTn). The attenuation between the RF input and the RF output is set by enable controls EN0, EN1, EN2, EN3.

The attenuator includes four attenuator cells 100, 110, 120, 130. The RF input and the RF output are connected in parallel to each of the attenuator cells 100, 110, 120, 130. The attenuator cells 100, 110, 120, 130 are individually enabled. The first attenuator cell 100 is enabled by the first enable control EN0; the second attenuator cell 110 is enabled by the second enable control EN1; the third attenuator cell 120 is enabled by the third enable control EN2; and the fourth attenuator cell 130 is enabled by the fourth enable control EN3.

Each of the attenuator cells 100, 110, 120, 130 includes a switchable capacitive divider. The first attenuator cell 100 includes a positive-side capacitive divider including capacitor 101 and capacitor 103. Capacitor 101 may be referred to as a coupling capacitor; capacitor 103 may be referred to as a dividing capacitor. A first terminal of capacitor 101 connects to the positive RF input and a second terminal of capacitor 101 connects to the positive RF output. A first terminal of capacitor 103 also connects to the positive RF output and a second terminal of capacitor 103 connects to re-channel transistor 107. N-channel transistor 107 has its drain connected to the second terminal of capacitor 103, its gate connected to the first enable control EN0, and its source connected to a ground reference (which may also be referred to as "ground"). N-channel transistor 107 operates as a switch and couples capacitor 103 to the ground reference or leaves capacitor 103 open (floating) depending on the first enable control. Capacitor 103 is generally much larger (e.g., 100 times larger) than capacitor 101.

The first attenuator cell 100 also includes a negative-side capacitive divider that is similar to the positive-side capacitive divider. The negative-side capacitive divider connects to the negative RF input and the negative RF output. The negative-side capacitive divider includes capacitor 102, capacitor 104, and n-channel transistor 108. The first attenuator cell 100, in the embodiment of FIG. 1, includes n-channel transistor 109 coupled between the positive-side capacitive divider and the negative-side capacitive divider at the drains of n-channel transistor 107 and n-channel transistor 108. The gate of n-channel transistor 109 connects to the first enable control. N-channel transistor 109 may, for example, reduce parasitic capacitances at the drains of n-channel transistor 107 and n-channel transistor 108 for a given differential-mode on-resistance of the switches. The reduced capacitances can increase the dynamic range of the attenuator.

N-channel transistor 107, n-channel transistor 108, and n-channel transistor 109 may be implemented using SoC input/output transistors rather than logic transistors. The input/output transistors generally have lower leakage than logic transistors. Transistor leakage could distort the RF output and impair performance of the attenuator. Other types of low-leakage transistors may also be used.

The second attenuator cell 110, the third attenuator cell 120, and the fourth attenuator cell 130 may be the same as or similar to the first attenuator cell 100.

A radio-frequency receiver using the attenuator will generally begin with the enable controls set to provide maximum attenuation. This avoids subjecting subsequent receiver circuits to high voltages (e.g., more than 3 volts) that could damage those circuits. The radio-frequency receiver can then lessen the attenuation to an operating level based on the level of the received signal. To further protect the receiver circuits from high voltages, the attenuator may include clamp circuits 151, 152 connected to the RF output. The clamp circuits 151, 152 can, for example, shunt high voltages on the RF output to ground. The clamp circuits may be the same as or similar to electrostatic discharge (ESD) protection circuits used in the SoC.

Figure 2:
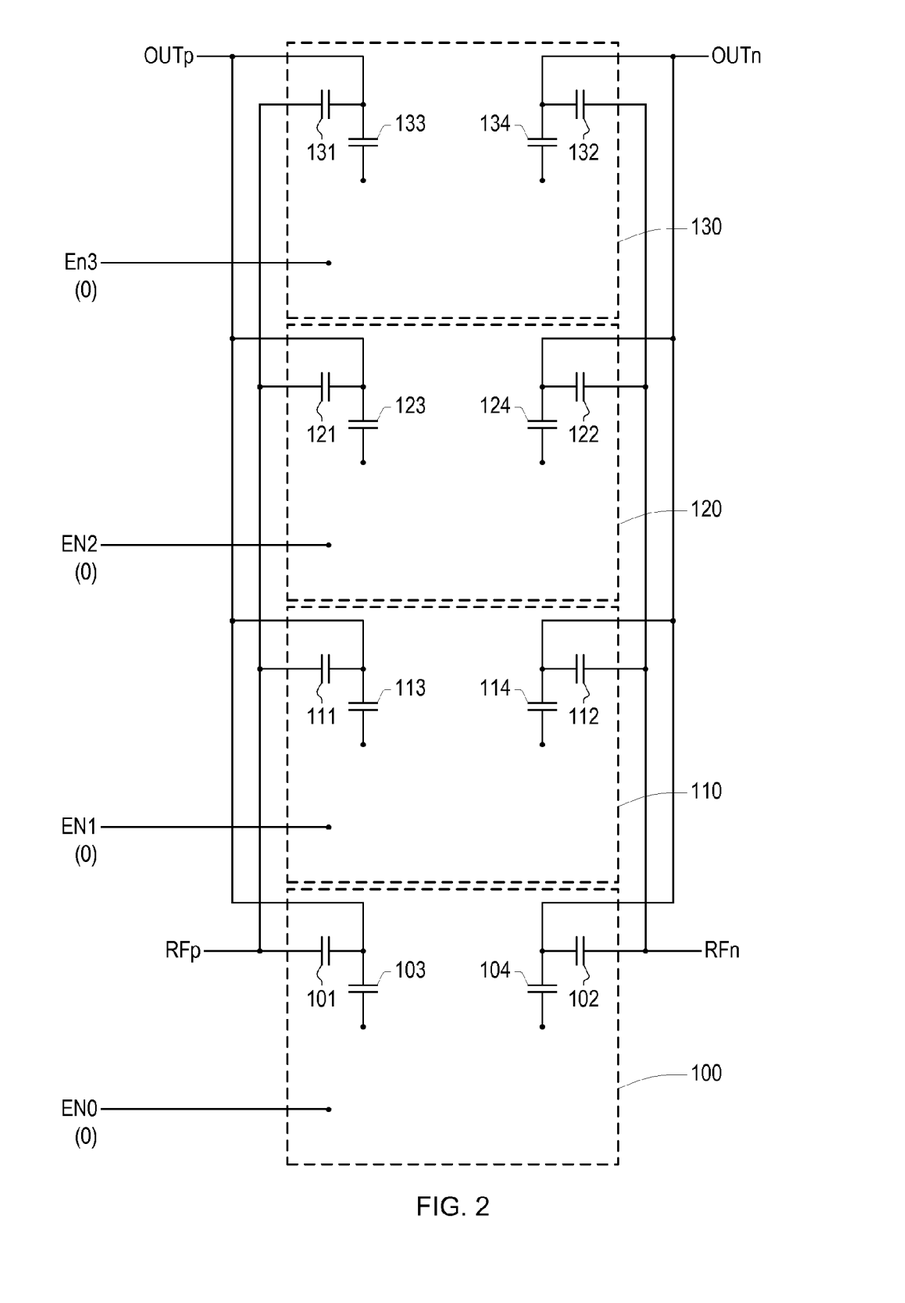
FIGS. 2-4 are schematic diagrams illustrating operation of the attenuator of FIG. 1.
Figure 3:
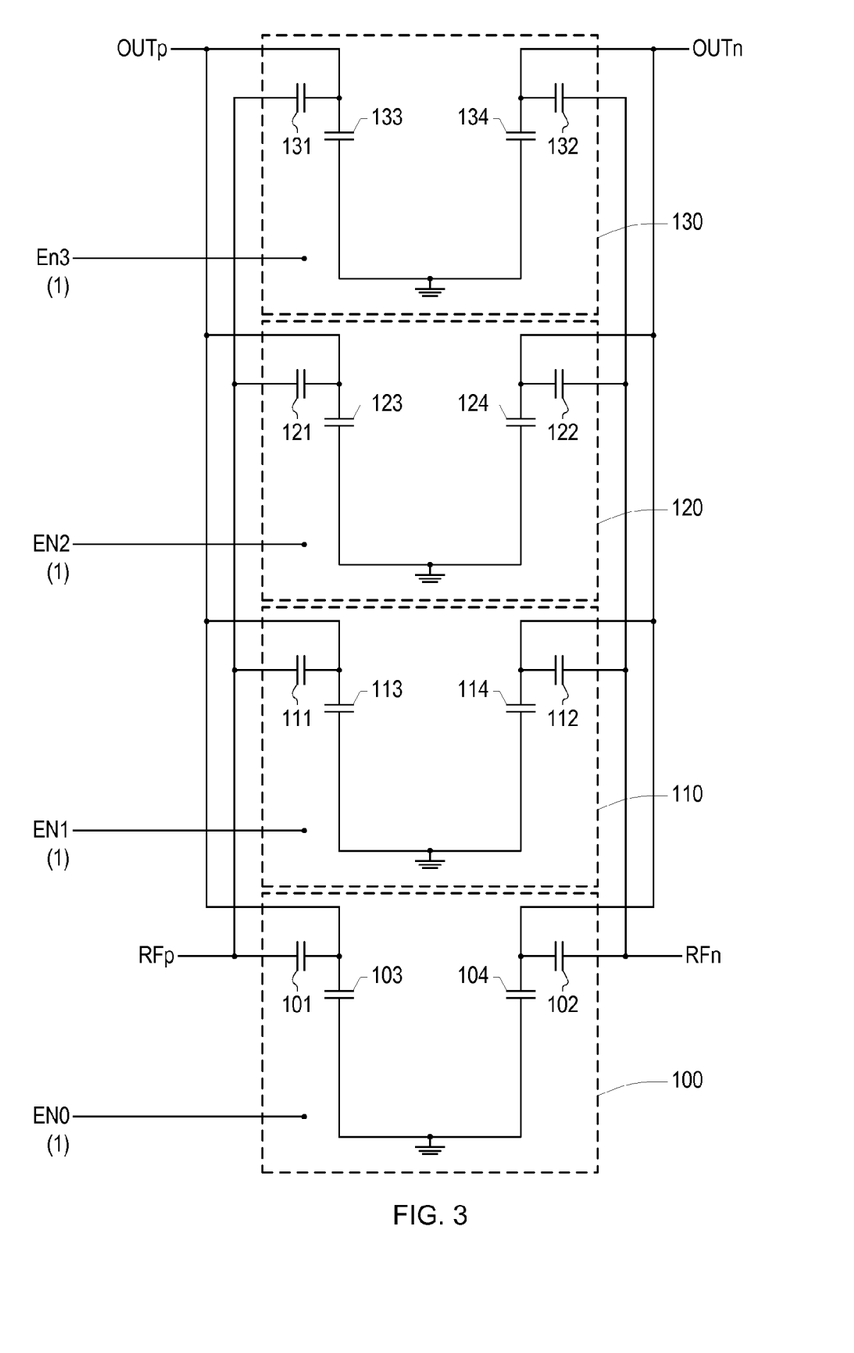
Figure 4:
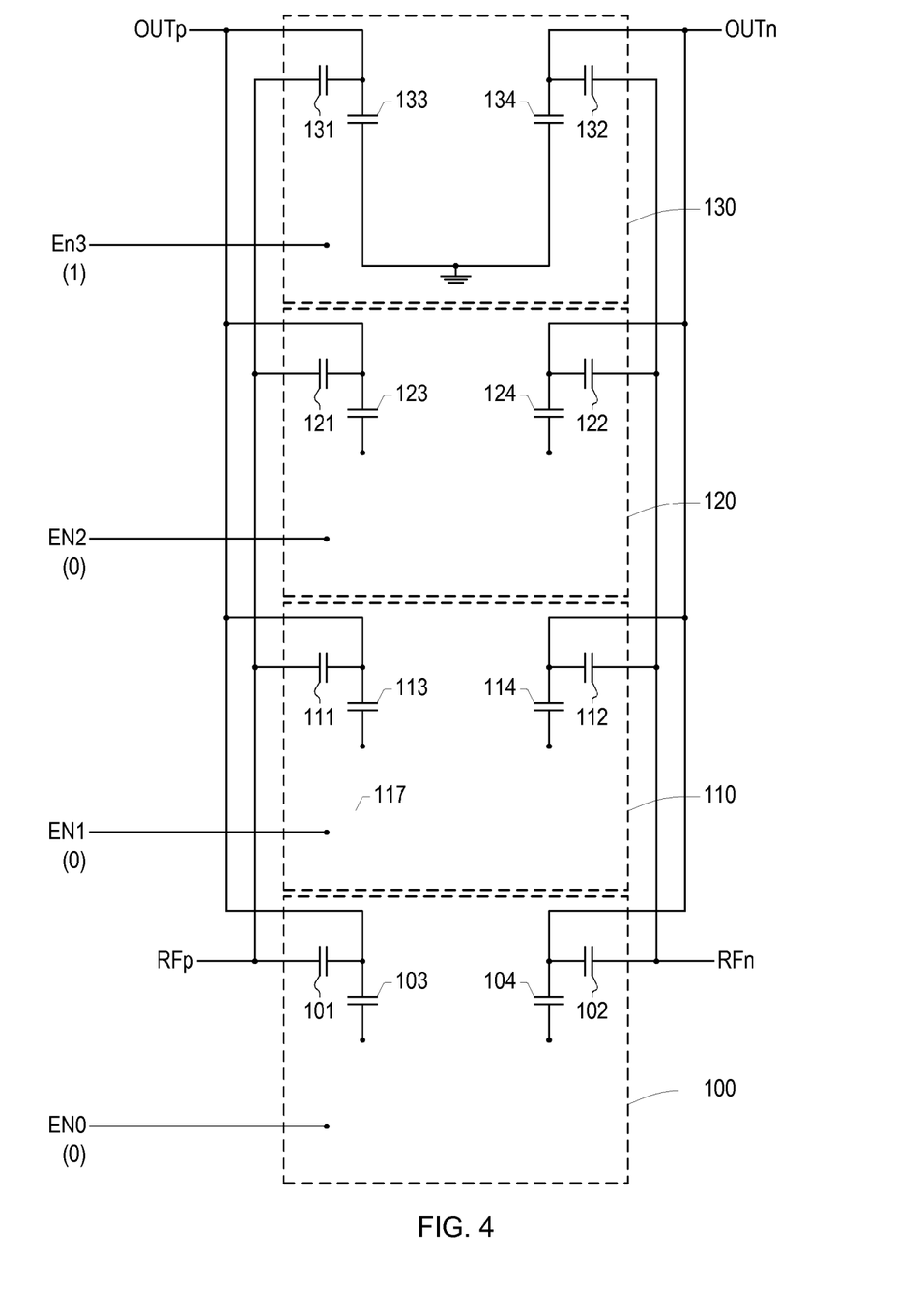

FIGS. 2-4 are schematic diagrams illustrating operation of the attenuator of FIG. 1. FIGS. 2-4 illustrate various attenuation settings. In each diagram, the switches in the attenuators cells (e.g., n-channel transistor 107, n-channel transistor 108, and re-channel transistor 109 in the first attenuator cell 100) are shown as short or open circuits depending the value (shown in parentheses) of the associated enable control.

FIG. 2 illustrates the no-attenuation setting of the attenuator. Each of the enable controls is ZERO and all of the switches are open. In the no-attenuation setting, the RF input is capacitively coupled to the RF output with no attenuation (there may be a small amount attenuation due to parasitic circuit elements, such as capacitance on the RF output).

FIG. 3 illustrates the high-attenuation setting of the attenuator. Each of the enable controls is ONE and all of the switches are closed. In the high-attenuation setting, the RF input is capacitively coupled to the RF output with high attenuation according to the relative capacitances of the attenuator cell capacitors.

FIG. 4 illustrates a low-attenuation setting of the attenuator. One of the enable controls (the third enable control) is ONE and the other enable controls are ZERO. Thus, the switches are closed in the third attenuator cell 130 and the switches in the other attenuator cells are open. In the low-attenuation setting of FIG. 4, the attenuation from the RF input to the RF output is about one-fourth the attenuation of the high-attenuation setting of FIG. 3 (the relative attenuation can differ from one-fourth as explained further below).

The performance of radio-frequency receivers where the received signal can have a large dynamic range can be improved when the attenuator has a large maximum attenuation and a small minimum attenuation. The term attenuation is used here to denote the ratio of the magnitude of the RF input to the magnitude of the RF output. The maximum attenuation is based on the ratio of the capacitance of the dividing capacitor (e.g., capacitor 103) to the capacitance of the coupling capacitor (e.g., capacitor 101). The minimum attenuation is based on the ratio of the capacitance of the coupling capacitor to parasitic capacitance to ground (e.g., capacitance on the RF output). Other parasitic capacitances, for example, between the RF input and the second terminal of the dividing capacitor (e.g., node Gp) do not increase the minimum attenuation. In the absence of parasitic capacitance, the minimum attenuation is 1 (the RF output equals the RF input).

Figure 5:
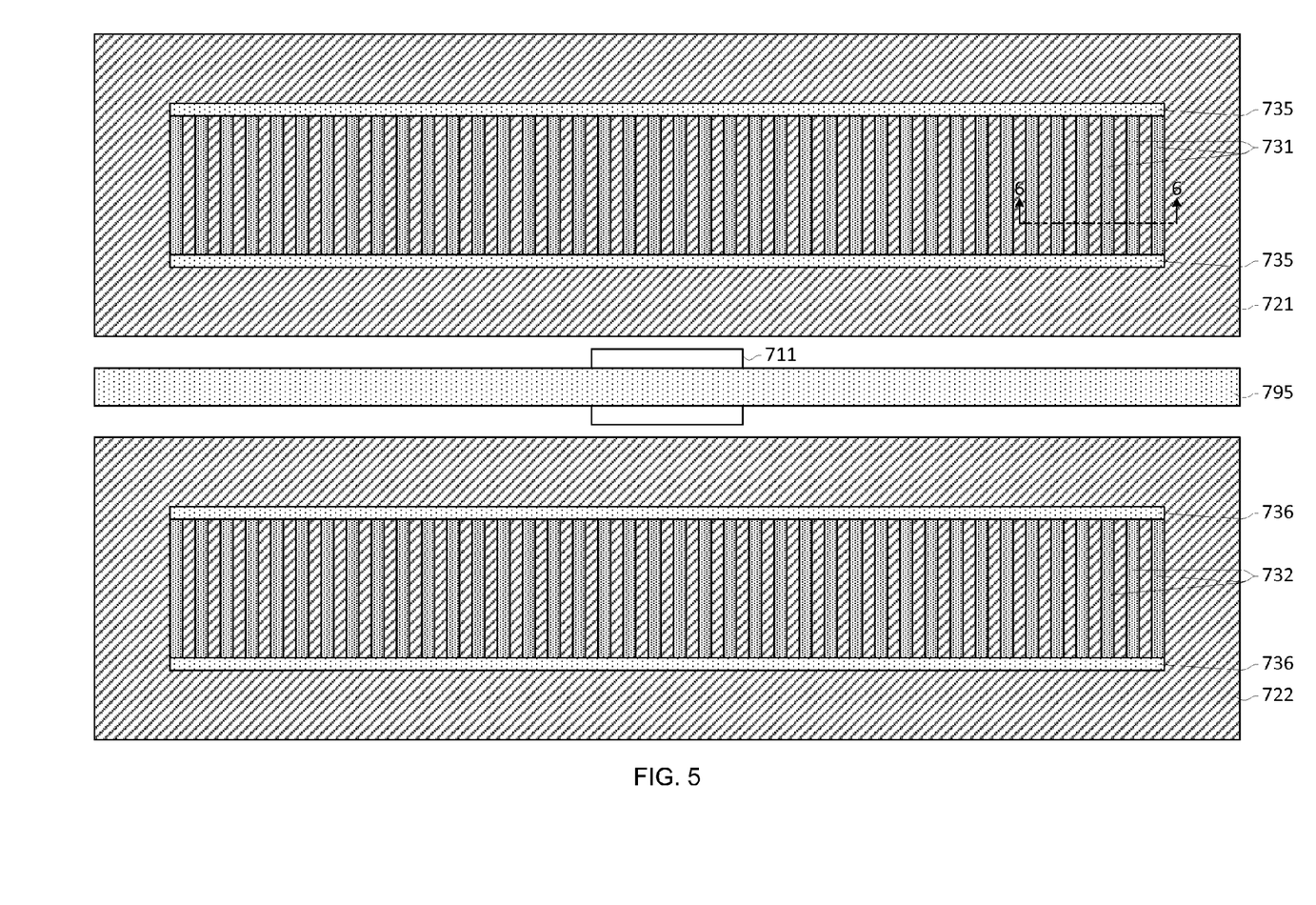
FIG. 5 is a layout diagram of an attenuator cell according to a presently disclosed embodiment.

FIG. 5 is a layout diagram of an attenuator cell according to a presently disclosed embodiment. The view of FIG. 5 is the view commonly used for designing the layout of an integrated circuit. For clarity, many details and layers (e.g., via layers) are not shown in FIG. 5. To provide a specific example, aspects of the layout will be described with reference to the first attenuator cell 100 of FIG. 1. The attenuator of FIG. 1 may be implemented using an array of the attenuator cell layouts.

The attenuator cell layout is arranged to improve attenuator performance by keeping parasitic capacitance between the RF output and ground low. For example, the coupling capacitor and associated dividing capacitor are formed in the same area. In contrast, some prior attenuators have located coupling and dividing capacitor pair in nearby or adjacent areas. Further, the RF input is used as a shield and separates the RF output (and intermediate nodes of the attenuator cell) from ground. Also, the ground connection to the switches is separated from the RF output. In addition to reducing harmful parasitic capacitances, forming the coupling capacitors and dividing capacitors in the same area can reduce the size (integrated circuit area) of the attenuator.

The attenuator cell layout includes a switch region 711 located centrally. The switch region 711 includes n-channel transistor 107, n-channel transistor 108, and re-channel transistor 109. A ground reference line 795 is routed longitudinally through the attenuator cell to connect to the switch region 711. The ground reference line 795 may be formed of a suitable metal layer, for example, a second metal layer ("metal 2").

The capacitors of the positive-side capacitive divider and negative-side capacitive divider are located above and below (in the orientation of FIG. 5) the ground reference line 795. Capacitor 103 (of the positive-side capacitive divider) is a metal-insulator-metal (MIM) capacitor formed with metal stripes 731 separated by dielectric. The metal stripes 731 are interconnected at connection regions 735. The connection regions 735 include metal layers and via layers arranged in a manner suitable for the metal layers used in the metal stripes 731. In addition to forming capacitor 103, the connection regions 735 are used to connect capacitor 103 to the attenuator cell. For example, the outer one of the connection regions 735 may connect to the positive RF output and the inner one of connection regions 735 may connect capacitor 103 to re-channel transistor 107 and n-channel transistor 109 in the switch region 711. Note that the ground reference line 795 is remote from the RF output thereby avoiding parasitic capacitance between the RF output and ground.

Capacitor 101 is formed using a metal plate 721. The metal plate 721 connects to the positive RF input. Capacitor 101 is formed by the vertical-flux capacitance between the metal plate 721 and the portion of the metal stripes 731 that are connected to the positive RF output. The vertical-flux capacitance between the metal plate 721 and the portion of the metal stripes 731 that are connected to the switches forms a parasitic capacitor (capacitor Cp2 in the circuit model of FIG. 7).

The negative-side capacitive divider is similarly formed in the lower portion of the attenuator cell layout. The negative-side capacitive divider includes metal stripes 732, connection regions 736, and metal plate 721.

Figure 6:
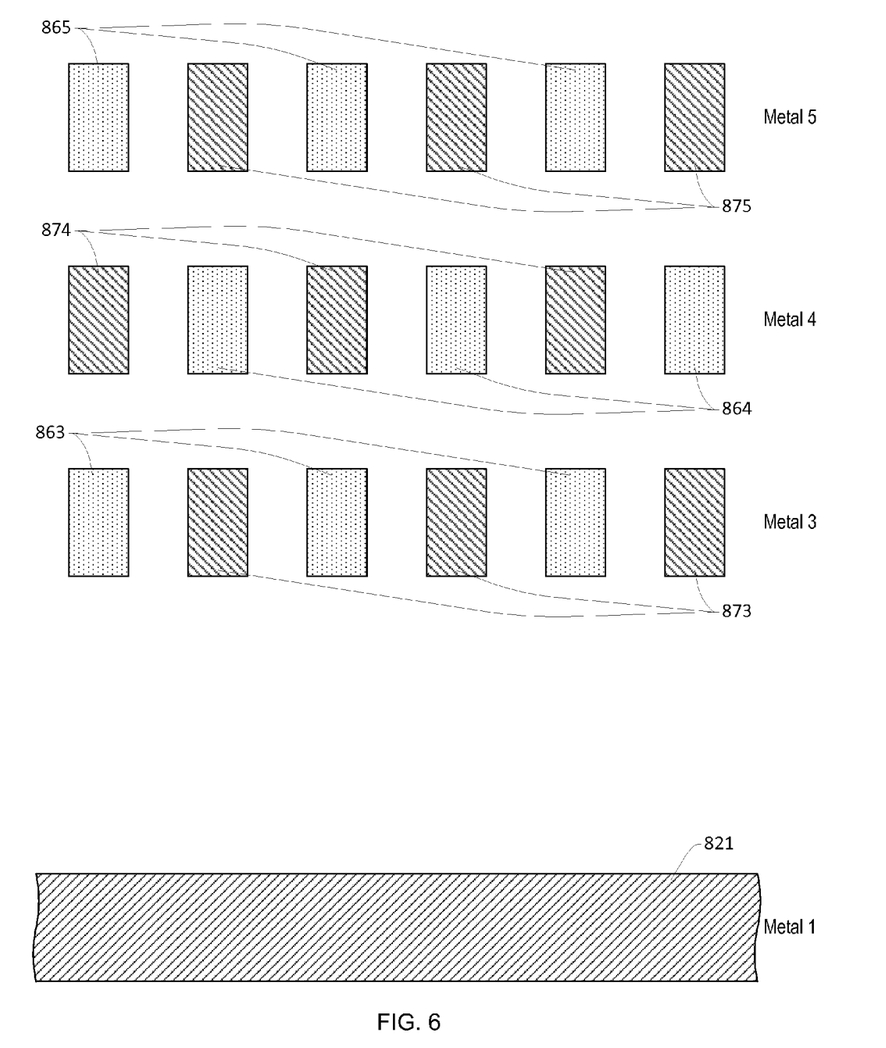
FIG. 6 is a cross-section of a portion of the attenuator cell layout indicated by line 6-6 in FIG. 5.

FIG. 6 is a cross-section of a portion of the attenuator cell layout indicated by line 7-7. The cross-section is for the attenuator cell fabricated in a six metal layer fabrication process.

Capacitor 103 (MIM capacitor) is formed with alternating metal stripes. In the embodiment of FIG. 6, the third metal layer ("Metal 3"), the fourth metal layer ("Metal 4"), and the fifth metal layer ("Metal 5") are used to form capacitor 103. The stripes are interconnected in a checkerboard manner with metal-3 stripes 863, metal-4 stripes 864, and metal-5 stripes 865 connected to the switches and metal-3 stripes 873, metal-4 stripes 874, and metal-5 stripes 875 connected to the positive RF output. Due to the large surface area of the capacitor terminals and their small separation, capacitor 103 has a large areal capacitance density. A lateral-flux capacitor where the capacitor terminals only alternate within layers may also be used.

Metal plate 821 (corresponding to metal plate 721 in FIG. 5) is formed of the first metal layer ("Metal 1," closest to the integrated circuit substrate). Note that the second metal layer is not used in the embodiment of FIG. 6. Capacitor 101 is formed between the metal plate 821 and metal-3 stripes 863. Due to the small surface area of the capacitor terminals and their large separation, capacitor 103 has a small areal capacitance density.

As seen in FIG. 5, metal plate 721 extends beyond the metal stripes 731. This reduces or eliminates fringe capacitance between the RF output (a first terminal of capacitor 103) or the drains of the n-channel transistors of the switches (a second terminal of capacitor 103) to ground (integrated circuit substrate). Instead, fringe capacitances from the terminals of capacitor 103 are to the RF input (metal plate 721). As discussed below with reference to the circuit model of FIG. 7, capacitances from the terminals of capacitor 103 to the RF input do not impair attenuator performance.

The attenuator cell layout illustrated in FIGS. 5 and 6 is for an example six metal layer fabrication process. Variations in the layout may be used in other fabrication processes or to provide different attenuator performance (e.g., different maximum attenuation). The maximum attenuation of the attenuator depends on the ratio of the capacitance of the dividing capacitor to the capacitance of the coupling capacitor. This ratio depends on the arrangement of metal layers as shown in FIG. 6. For example, the omission of the second metal layer increases the separation between the RF input and the RF output and thereby decreases the coupling capacitance. The dividing capacitance could be varied, for example, by changing the metal layers used or the spacing of the metal stripes of the metal-insulator-metal capacitor. Using more metal layers or decreasing spacing between the metal stripes will increase the dividing capacitance. In the example six metal layer fabrication process, the sixth metal layer has very large minimum width and spacing. Thus, the sixth metal layer is not used in the MIM capacitor.

Figure 7:
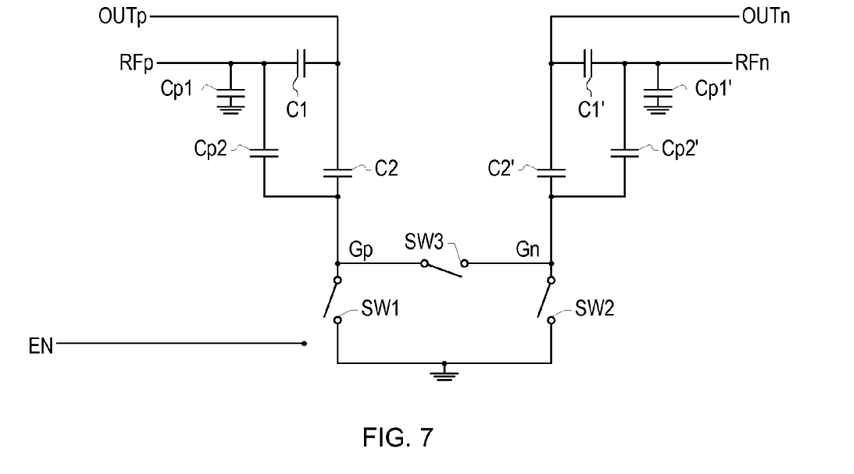
FIG. 7 is a schematic diagram of a circuit model of an attenuator cell of the attenuator of FIG. 1.

FIG. 7 is a schematic diagram of a circuit model of an attenuator cell of the attenuator of FIG. 1. For the first attenuator cell 100, switch SW1 corresponds to re-channel transistor 107, switch SW2 corresponds to n-channel transistor 108, switch SW3 corresponds to n-channel transistor 109, capacitor C1 corresponds to capacitor 101, capacitor C2 corresponds to capacitor 103, capacitor C1' corresponds to capacitor 102, and capacitor C2' corresponds to capacitor 103. For clear and concise description, the circuit model will be described only for the positive-side capacitive divider. The negative-side capacitive divider functions in a like manner.

Capacitor Cp1, capacitor Cp2, capacitor Cp2', and capacitor Cp2' represent parasitic capacitance associated with the implementation of capacitor C1, capacitor C2, capacitor C1', and capacitor C2'. Capacitor Cp1, for the layout of FIGS. 5 and 6, is principally the capacitance between metal plate 721 and the integrated circuit substrate. Capacitor Cp2, for the layout of FIGS. 5 and 6, is principally the capacitance between metal plate 721 and the metal-3 stripes 873, which connect to the positive RF output.

When the attenuator cell is disabled, the switches are open and the positive RF input is capacitively coupled to the positive RF output by capacitor C1. The positive RF input is also capacitively coupled to the positive RF output by the series combination of capacitor Cp2 and capacitor C2. Since the series combination of capacitor Cp2 and capacitor C2 is in parallel with capacitor C1, operation of the disabled attenuator cell can be understood with the effect of capacitor Cp2 and capacitor C2 ignored. Operation of the disabled attenuator cell can also be understood with the effect of parasitic capacitances associated with the switches ignored (e.g., the parasitic capacitances associated with the switches can be small compared to the circuit element capacitances). Capacitor Cp1, which is between the positive RF input and the ground reference, only adds capacitive loading to the positive RF input and operation of the attenuator cell can be understood with capacitor Cp1 ignored.

When the attenuator cell is enabled, the switches are closed. Since capacitor Cp1 and capacitor Cp2 are in parallel between the positive RF input and the ground reference, capacitor Cp1 and capacitor Cp2 only add capacitive loading to the positive RF input and operation of the attenuator cell can be understood with capacitor Cp1 and capacitor Cp2 ignored. Capacitor C1 and capacitor C2 form a voltage divider between the positive RF input and the positive RF output. The attenuation from RF input to RF output is $C_1/(C_1+C_2)$, where $C_1$ is the capacitance of capacitor C1 and $C_2$ is the capacitance of C2. This attenuation is approximately $C_1/C_2$ for $C_2$ much greater than $C_1$.

Note that the attenuator cell does not have material parasitic capacitance between the positive RF output and ground or across switch SW1 (between node Gp and ground). Such capacitances alter operation of the attenuator. Capacitances to nodes other than ground (e.g., a voltage supply) would similarly alter operation of the attenuator.

Figure 8:
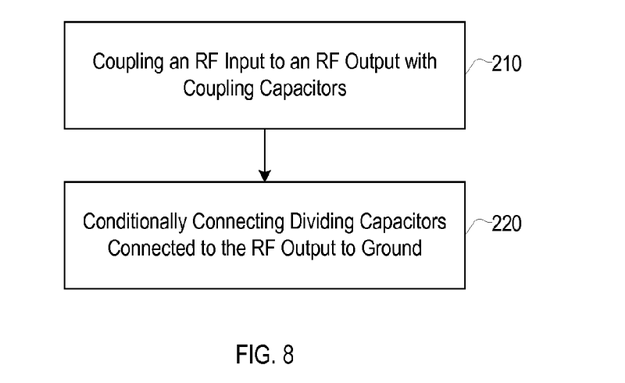
FIG. 8 is a flowchart of a process for variably attenuating an RF signal according to a presently disclosed embodiment.

FIG. 8 is a flowchart of a process for variably attenuating an RF signal according to a presently disclosed embodiment. Steps of the process may be, for example, performed using the attenuator FIG. 1 and will be described with reference thereto. The process produces an RF output having a selectable attenuation relative to an RF input.

In block 210, the process couples the RF input to the RF output with a plurality of coupling capacitors. For example, capacitors 101, 111, 121, 131 couple the positive RF input to the positive RF output.

In block 220, the process conditionally connects terminals of a plurality of dividing capacitors to ground. For example, n-channel transistors 107, 117, 127, 137 conditionally connect terminals of capacitors 103, 113, 123, 133 to ground. When the terminals of the dividing capacitors are not connected to ground, they are left open. The process conditionally connects the terminals based on a desired attenuation from the RF input to the RF output. The terminals of the dividing capacitors that are not conditionally connected to ground are connected to the RF output.

The process FIG. 8 may be modified, for example, by adding, omitting, reordering, or altering blocks. Additionally, blocks may be performed concurrently.

Although features of the invention are described above for particular embodiments, many variations of the invention are possible. For example, attenuators may be formed using other fabrication processes including processes with different numbers of metal layers and different types of transistors. Additionally, attenuators may have single-ended (rather than differential) inputs and outputs. Further, attenuators may have different numbers of attenuator cells, may have attenuator cells of different sizes (e.g., different capacitances), and attenuator cells may have shared enables (e.g., binary weighting). Different switches may be used in attenuator cells, for example, p-channel transistors that conditionally switch intermediate nodes in an attenuator cell to a voltage supply. In yet another variation, switches are omitted from an attenuator cell.

Directional terms, such above, below, left, and right, are used to describe some features. This terminology is used to provide clear and concise descriptions. The terms are relative and no particular absolute orientation should be inferred. Additionally, features of the various embodiments may be combined in combinations that differ from those described above.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A high-voltage radio-frequency (RF) attenuator for selectively attenuating an RF input to produce an RF output, the attenuator comprising:
    an attenuator cell comprising
        a coupling capacitor having a first terminal formed by a metal plate connected to the RF input and a second terminal connected to the RF output, and
        a dividing capacitor having a first terminal connected to the RF output and a second terminal connected to a switch to a ground reference,
        wherein the metal plate is located between the dividing capacitor and an integrated circuit substrate.

2. The attenuator of claim 1, wherein the metal plate connected to the RF input shields the RF output from the ground reference.

3. The attenuator of claim 2, wherein the metal plate extends beyond the metal-insulator-metal capacitor.

4. The attenuator of claim 2, wherein the metal plate is formed in a first metal layer.

5. The attenuator of claim 4, wherein the plurality of metal stripes of the metal-insulator-metal capacitor include a third metal layer and a fourth metal layer.

6. The attenuator of claim 4, wherein the plurality of metal stripes of the metal-insulator-metal capacitor do not include a second metal layer.

7. The attenuator of claim 1,
    wherein the dividing capacitor is formed by a metal-insulator-metal capacitor having a plurality of metal stripes, and
    wherein the second terminal of the coupling capacitor is formed by a portion of the metal-insulator-metal capacitor connected to the RF output.

8. The attenuator of claim 1, further comprising a clamp circuit connected to the RF output.

9. The attenuator of claim 1, wherein the switch is an n-channel transistor.

10. The attenuator of claim 9, wherein the n-channel transistor is a low-leakage transistor.

11. The attenuator of claim 1, further comprising a second attenuator cell comprising
    a second coupling capacitor having a first terminal formed by a metal plate connected to the RF input and a second terminal connected to the RF output, and
    a second dividing capacitor having a first terminal connected to the RF output and a second terminal connected to a second switch to the ground reference, wherein the metal plate of the second coupling capacitor is located between the second dividing capacitor and the integrated circuit substrate.

12. A high-voltage radio-frequency attenuator for selectively attenuating an RF input including a positive RF input and a negative RF input to produce an RF output including a positive RF output and a negative RF output, the attenuator comprising:
an attenuator cell comprising
a positive-side capacitive divider including a coupling capacitor having a first terminal connected to the positive RF input and a second terminal connected to the positive RF output, and a dividing capacitor having a first terminal connected to the positive RF output, a second terminal of the dividing capacitor connected to a first switch to a ground reference, wherein the coupling capacitor and the dividing capacitor are formed in a same integrated circuit area, and
a negative-side capacitive divider including a coupling capacitor having a first terminal connected to the negative RF input and a second terminal connected to the negative RF output, and a dividing capacitor having a first terminal connected to the negative RF output, a second terminal of the dividing capacitor connected to a second switch to the ground reference, wherein the coupling capacitor and the dividing capacitor are formed in a same integrated circuit area.

13. The attenuator of claim 12, wherein the positive RF input is arranged to shield the positive RF output from the ground reference, and the negative RF input is arranged to shield the negative RF output from the ground reference.

14. The attenuator of claim 12,
wherein the positive-side capacitive divider of the attenuator cell further comprises
a metal plate connected to the positive RF input,
wherein the dividing capacitor is formed by a metal-insulator-metal capacitor having a plurality of metal stripes,
wherein the metal plate is located between the metal-insulator-metal capacitor and an integrated circuit substrate, and
wherein terminals of the coupling capacitor are formed by the metal plate and a portion of the metal-insulator-metal capacitor connected to the positive RF output, and
wherein the negative-side capacitive divider of the attenuator cell further comprises
a metal plate connected to the negative RF input,
wherein the dividing capacitor is formed by a metal-insulator-metal capacitor having a plurality of metal stripes,
wherein the metal plate is located between the metal-insulator-metal capacitor and the integrated circuit substrate, and
wherein terminals of the coupling capacitor are formed by the metal plate and a portion of the metal-insulator-metal capacitor connected to the negative RF output.

15. The attenuator of claim 14, wherein the metal plate of the positive-side capacitive divider of the attenuator cell extends beyond the metal-insulator-metal capacitor of the positive-side capacitive divider of the attenuator cell, and
wherein the metal plate of the negative-side capacitive divider of the attenuator cell extends beyond the metal-insulator-metal capacitor of the negative -side capacitive divider of the attenuator cell.

16. The attenuator of claim 14, wherein the first switch and the second switch are disposed in a switch region disposed between the metal plate of the positive-side capacitive divider of the attenuator cell and the metal plate of the negative-side capacitive divider of the attenuator cell.

17. The attenuator of claim 14, wherein the metal plates are formed in a first metal layer.

18. The attenuator of claim 17, wherein the plurality of metal stripes of the metal-insulator-metal capacitors include a third metal layer and a fourth metal layer.

19. The attenuator of claim 17, wherein the plurality of metal stripes of the metal-insulator-metal capacitors do not include a second metal layer.

20. The attenuator of claim 12, further comprising a clamp circuit connected to the positive RF output and a clamp circuit connected to the negative RF output.

21. The attenuator of claim 12, wherein the first switch and the second switch are n-channel transistors.

22. The attenuator of claim 21, wherein the n-channel transistors are low-leakage transistors.

23. The attenuator of claim 12, wherein the attenuator cell further comprises a third switch coupled between the second terminal of the dividing capacitor of the positive-side capacitive divider and the second terminal of the dividing capacitor of the negative-side capacitive divider.

24. The attenuator of claim 12, further comprising a second attenuator cell comprising
a second positive-side capacitive divider including a coupling capacitor having a first terminal connected to the positive RF input and a second terminal connected to the positive RF output, and a dividing capacitor having a first terminal connected to the positive RF output, a second terminal of the dividing capacitor connected to a third switch to ground, wherein the coupling capacitor and the dividing capacitor are formed in a same integrated circuit area, and
a second negative-side capacitive divider including a coupling capacitor having a first terminal connected to the negative RF input and a second terminal connected to the negative RF output, and a dividing capacitor having a first terminal connected to the negative RF output, a second terminal of the dividing capacitor connected to a fourth switch to ground, wherein the coupling capacitor and the dividing capacitor are formed in a same integrated circuit area.

25. A method for variably attenuating a radio-frequency (RF) input, the method comprising:
coupling the RF input to an RF output using a plurality of coupling capacitors each coupling capacitor of the plurality of coupling capacitors having a first terminal formed by a metal plate connected to the RF input and a second terminal connected to the RF output; and
conditionally connecting terminals of a plurality of dividing capacitors to ground,
wherein the metal plate of each coupling capacitor of the plurality of coupling capacitors is located between a corresponding one of the plurality of dividing capacitors and an integrated circuit substrate.

26. The method of claim 25, wherein the metal plates connected to the RF input shield the RF output from a ground reference.

27. The method of claim 25, wherein each of the plurality of dividing capacitors is a metal-insulator-metal capacitor having a plurality of metal stripes.

28. The method of claim 27, wherein each of the coupling capacitors is formed by a metal plate and a portion of the metal-insulator-metal capacitors connected to the RF output.

29. An apparatus, comprising:
a coupling capacitor means having a first terminal formed by a metal plate connected to an RF input and a second terminal connected to an RF output, and
a dividing capacitor means having a first terminal connected to the RF output and a second terminal connected to a switch to a ground reference,
wherein the metal plate is located between the dividing capacitor means and an integrated circuit substrate.

30. The apparatus of claim 29, wherein the metal plate connected to the RF input shields the RF output from the ground reference.

31. The apparatus of claim 29,
wherein the dividing capacitor means is formed by a metal-insulator-metal capacitor having a plurality of metal stripes, and
wherein terminals of the coupling capacitor means are formed by the metal plate and a portion of the metal-insulator-metal capacitor connected to the RF output.

32. The apparatus of claim 31, wherein the metal plate extends beyond the metal-insulator-metal capacitor.

33. The apparatus of claim 31, wherein the metal plate is formed in a first metal layer.

34. The apparatus of claim 33, wherein the plurality of metal stripes of the metal-insulator-metal capacitor include a third metal layer and a fourth metal layer.

35. The apparatus of claim 33, wherein the plurality of metal stripes of the metal-insulator-metal capacitor do not include a second metal layer.

36. The apparatus of claim 29, further comprising a clamp circuit connected to the RF output.

37. The apparatus of claim 29, wherein the switch is an n-channel transistor.

38. The apparatus of claim 37, wherein the n-channel transistor is a low-leakage transistor.

* * * * *